(12) United States Patent
Maeda et al.

(10) Patent No.: US 11,898,968 B2
(45) Date of Patent: Feb. 13, 2024

(54) INSPECTION APPARATUS ADJUSTMENT SYSTEM AND INSPECTION APPARATUS ADJUSTMENT METHOD

(71) Applicant: Hitachi High-Tech Corporation, Tokyo (JP)

(72) Inventors: Taichi Maeda, Tokyo (JP); Yuko Sasaki, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 292 days.

(21) Appl. No.: 17/594,804

(22) PCT Filed: May 15, 2019

(86) PCT No.: PCT/JP2019/019274
§ 371 (c)(1),
(2) Date: Oct. 29, 2021

(87) PCT Pub. No.: WO2020/230286
PCT Pub. Date: Nov. 19, 2020

(65) Prior Publication Data
US 2022/0252525 A1 Aug. 11, 2022

(51) Int. Cl.
*G01N 21/95* (2006.01)
*G06T 7/00* (2017.01)
*G01N 23/2251* (2018.01)

(52) U.S. Cl.
CPC ..... *G01N 21/9501* (2013.01); *G01N 23/2251* (2013.01); *G06T 7/0004* (2013.01);
(Continued)

(58) Field of Classification Search
CPC .......... G01N 21/9501; G01N 23/2251; G01N 2223/6116; G06T 7/0004; G06T 2207/10061; G06T 2207/30148
See application file for complete search history.

(56) References Cited

U.S. PATENT DOCUMENTS 7,728,294 B2 * 6/2010 Hiroi ................. H01J 37/28
250/311
9,892,504 B2 * 2/2018 Kotake ............... G01N 21/956
(Continued)

FOREIGN PATENT DOCUMENTS

JP          9-245709 A      9/1997
JP       2006-32202 A      2/2006
(Continued)

OTHER PUBLICATIONS

International Search Report (PCT/ISA/210) issued in PCT Application No. PCT/JP2019/019274 dated Jul. 30, 2019 with English translation (five (5) pages).
(Continued)

*Primary Examiner* — Hung V Nguyen
(74) *Attorney, Agent, or Firm* — Crowell & Moring LLP

(57) ABSTRACT

Disclosed is a solution for quickly specifying an optical condition of a wafer to be inspected, and in particular, accelerating optical condition setting after obtaining a customer wafer. An inspection apparatus automatic adjustment system according to the present invention includes an analysis-condition-setting interface that inputs analysis conditions; an analysis-execution unit that performs analysis; an inspection-device model and model DB used for analysis; an analysis-result DB that stores analysis results; an observation-condition setting interface that inputs a wafer pattern, a focus point, an optimization index, and a priority; a wafer-pattern search unit that searches for a wafer pattern similar to the input wafer pattern; an optical-condition-extraction unit that extracts, from the analysis result DB, the optimum optical condition for the similar wafer pattern and the focus point; and an optical-condition-setting unit that generates a control signal corresponding to the optical condition and transmits the control signal to the inspection apparatus.

15 Claims, 9 Drawing Sheets

(52) U.S. Cl.
CPC .............. *G01N 2223/6116* (2013.01); *G06T 2207/10061* (2013.01); *G06T 2207/30148* (2013.01)

(56) References Cited

U.S. PATENT DOCUMENTS

| | | | |
|---|---|---|---|
| 11,415,526 B2* | 8/2022 | Duffy | ................. G01N 21/8806 |
| 11,561,184 B2* | 1/2023 | Tada | ....................... G06T 7/001 |
| 2006/0016990 A1 | 1/2006 | Suzuki et al. | |
| 2013/0150998 A1 | 6/2013 | Matsuoka et al. | |
| 2017/0160082 A1 | 6/2017 | Shinoda et al. | |

FOREIGN PATENT DOCUMENTS

| | | |
|---|---|---|
| JP | 2010-182895 A | 8/2010 |
| JP | 2012-49411 A | 3/2012 |
| JP | 2012-104264 A | 5/2012 |
| JP | 2013-200180 A | 10/2013 |
| WO | WO 2015/198926 A1 | 12/2015 |

OTHER PUBLICATIONS

Japanese-language Written Opinion (PCT/ISA/237) issued in PCT Application No. PCT/JP2019/019274 dated Jul. 30, 2019 (three (3) pages).

* cited by examiner

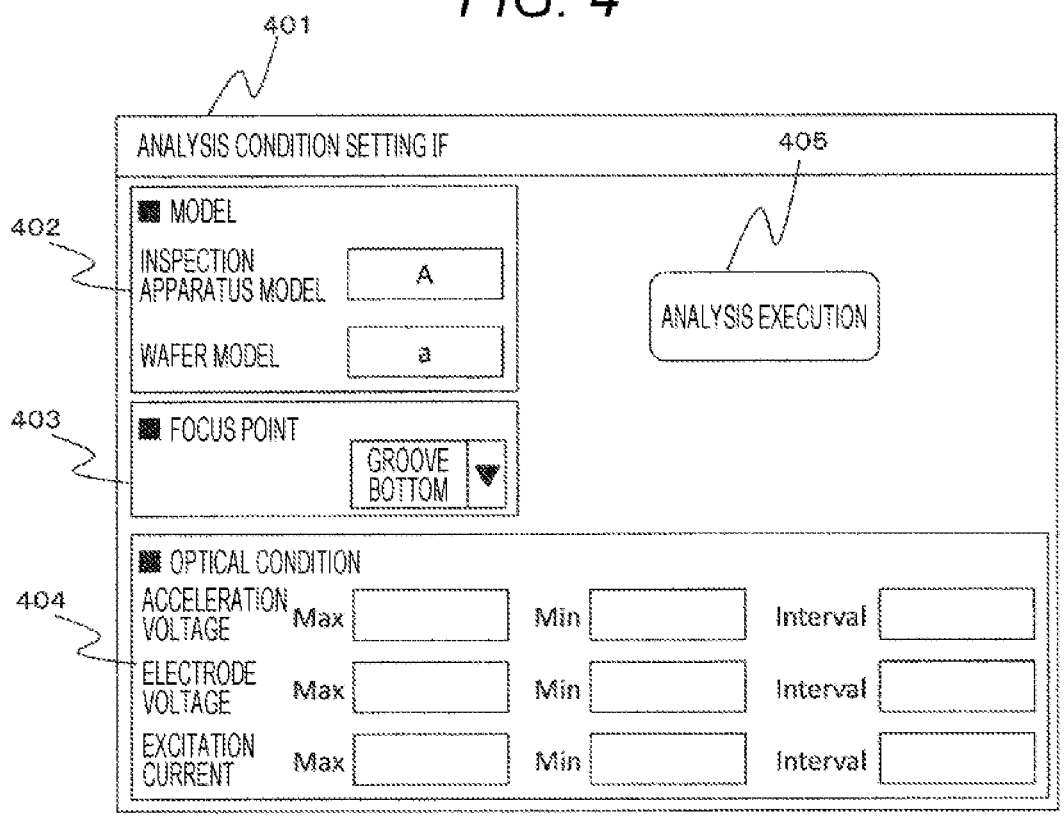

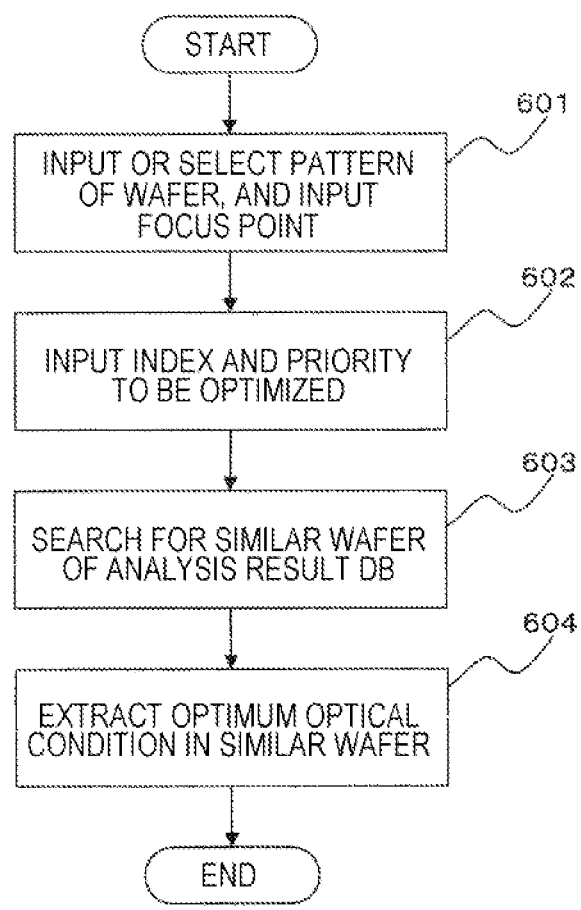

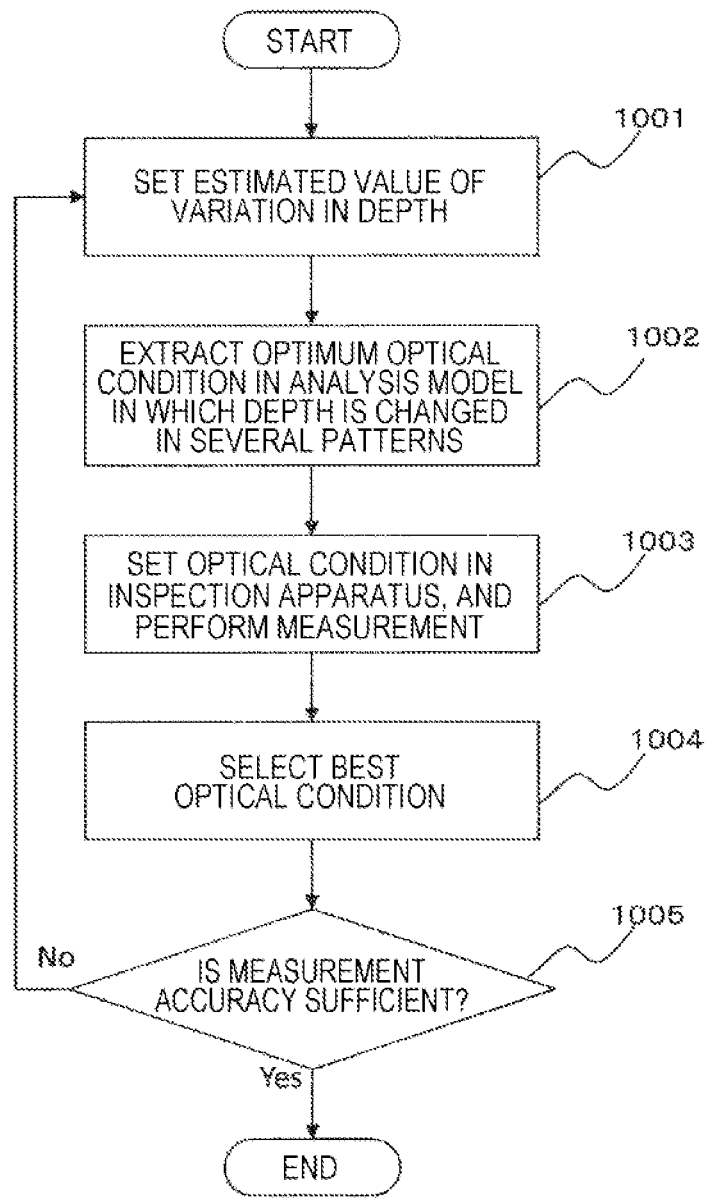

INSPECTION APPARATUS ADJUSTMENT SYSTEM AND INSPECTION APPARATUS ADJUSTMENT METHOD

TECHNICAL FIELD

The present invention relates to a technology for automatically adjusting an inspection apparatus of a sample. The sample includes a semiconductor wafer (hereinafter, also referred to as a wafer). The inspection apparatus also includes an observation apparatus.

BACKGROUND ART

As an inspection apparatus that obtains an image by irradiating a sample with an electron beam (primary electrons) and detecting signal electrons (secondary electrons) secondarily generated from the sample, there is a scanning electron microscope (SEM). An inspection apparatus that inspects a semiconductor wafer includes inspection apparatuses using the SEM, and one of the inspection apparatuses is a critical dimension SEM (CD-SEM). Semiconductors are becoming finer year by year, and there is an increasing demand for improvement of resolution and measurement reproducibility, reduction of measurement errors between the inspection apparatuses, and the like for the CD-SEM. In order to obtain a high-resolution SEM image, it is necessary to correctly set an optical condition when the wafer is irradiated with an electron beam. Examples of the optical condition include an acceleration voltage of the electron beam, an excitation current of a lens, and voltages of various electrodes. An optimum value of the condition varies depending on the specification of the wafer and a focus point which is an observation position. Wafers have various materials and pattern shapes, and when a type of a wafer to be inspected is greatly different, it is necessary to adjust an optimum optical condition again. Since an adjustment work is a complicated work of handling a plurality of optical conditions, it is difficult to perform the adjustment work unless a person understands the mechanism of a target CD-SEM in detail. That is, even after the CD-SEM is delivered to a customer, when the inspection wafer is greatly changed, it is necessary for a specialized company to adjust the optical condition on the customer side. Since the CD-SEM is integrated into a production line, when the CD-SEM is stopped for adjustment, production efficiency of the wafer deteriorates. Thus, automation and acceleration of optical condition setting are required for the CD-SEM.

PTL 1 discloses a method for automatically optimizing an optical condition by using analysis and an observation image of a wafer. This technology is a method for obtaining an optimum optical condition for an inspection apparatus by comparing an analysis result with the observation image and correcting an analysis model. In a case where there is a minute undulation on a wafer surface, when an observation position changes, since a height changes, the optimum optical condition changes. However, when there is the corrected analysis model, the optimum optical condition for the height can be predicted.

PTL 2 discloses a method for automatically searching for an observation position of a wafer by using a characteristic image of the wafer captured in advance as a model. This technology is a method that stores an optical condition at the time of capturing when a location coincident with the image captured in advance is detected by using pattern recognition when a specific observation position is searched for and automatically sets the optical condition when the observation position is detected.

CITATION LIST

Patent Literatures

PTL 1: JP 2006-32202 A
PTL 2: JP H09-245709 A

SUMMARY OF INVENTION

Technical Problem

In PTL 1, the analysis model is corrected by using the observation image of the wafer, and the optimum optical condition is predicted. However, since this method requires the observation image, this method cannot be applied unless the wafer is obtained.

In PTL 2, the image of the wafer is similarly required, and this method cannot be applied unless the wafer is obtained. Since only a limited optical condition used for capturing the image is stored, the optimum optical condition is not necessarily obtained at a position other than the captured position.

An object of the present invention is to quickly set an optical condition by creating an analysis model of a wafer predicted from a trend of semiconductor development and customer information, predicting an optical condition by analysis, and presenting the optical condition with a priority as soon as a specification of a customer wafer can be grasped.

Solution to Problem

In order to solve the above problem, an optical condition in inspection and capturing of a sample in an inspection apparatus is specified by using a database that stores an analysis result in which an inspection apparatus model indicating a model of the inspection apparatus, a sample model indicating a model of the sample, and a focus point are associated. More specifically, corresponding image data (pattern) is stored in the analysis result, an image similar to the image data (pattern) captured by the inspection apparatus is searched for, and an optical condition indicating the analysis result of the searched image is specified.

The present invention also includes extracting optical condition candidates according to a designated priority order.

Advantageous Effects of Invention

According to the present invention, the optical condition can be set more efficiently.

BRIEF DESCRIPTION OF DRAWINGS

FIG. 4 is an example of an input screen of the inspection apparatus automatic adjustment system according to the first embodiment.

FIG. 5 is an example of an analysis result DB 104 of the inspection apparatus automatic adjustment system according to the first embodiment.

FIG. 6 is a diagram illustrating a flow at the time of using the inspection apparatus automatic adjustment system according to the first embodiment.

FIG. 10 is a diagram illustrating a flow for coping with variations in dimensions according to a third embodiment.

DESCRIPTION OF EMBODIMENTS

Figure 1:
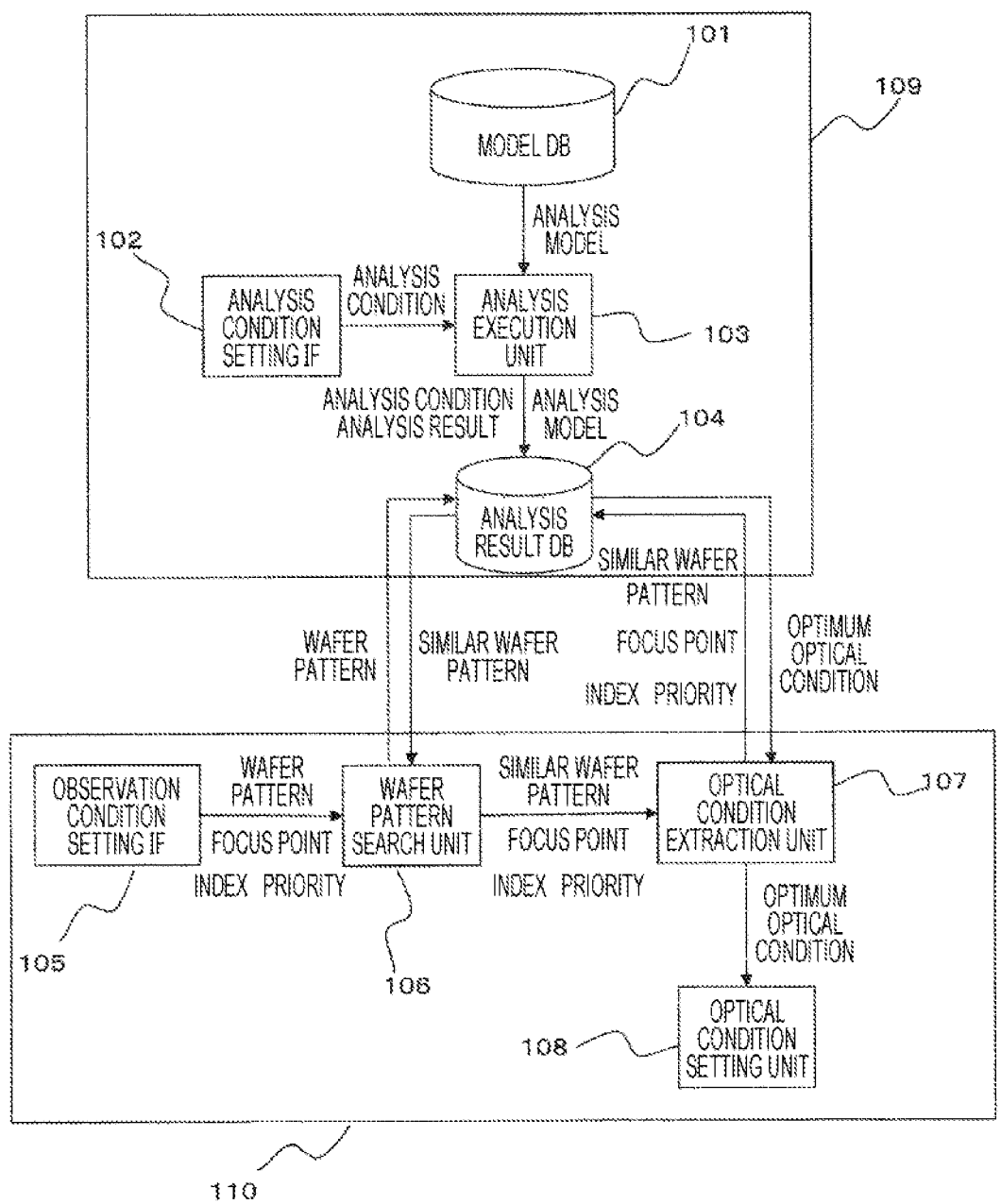
FIG. 1 is a configuration diagram of an inspection apparatus automatic adjustment system according to a first embodiment.

In order to quickly set an optimum optical condition after obtaining a customer wafer, it is effective to create an analysis model of a wafer based on prediction of a material and a pattern of the wafer in advance and obtain the optical condition by analysis. Thus, during or after the design of an inspection apparatus, the analysis is executed before the customer wafer is obtained, and an analysis result DB is created. The analysis model includes a sample model regarding a sample and an inspection apparatus model for the inspection apparatus. The sample model includes a wafer model for a semiconductor wafer. Note that the term "optimum" in the present specification includes a term that meets a predetermined condition (index), and is not necessarily limited to the most appropriate meaning.

Hereinafter, embodiments of the present invention will be appropriately described in detail with reference to the drawings. In the drawings, the same reference signs are given to common portions, and redundant description will be omitted.

First Embodiment

FIG. 1 illustrates an inspection apparatus automatic adjustment system according to a first embodiment. The inspection apparatus automatic adjustment system includes a model DB 101, an analysis condition setting IF 102, an analysis execution unit 103, an analysis result DB 104, an observation condition setting IF 105, a wafer pattern search unit 106, an optical condition extraction unit 107, and an optical condition setting unit 108. The model DB 101, the analysis condition setting IF 102, the analysis execution unit 103, and the analysis result DB 104 are defined as an analysis result DB creation unit 109, and the observation condition setting IF 105, the wafer pattern search unit 106, the optical condition extraction unit 107, and the optical condition setting unit 108 are defined as an optimum optical condition extraction unit 110.

A configuration of the analysis result DB creation unit 109 will be described. In the analysis result DB creation unit 109, analysis conditions are set by the analysis condition setting IF 102 by using an analysis model of the inspection apparatus and an analysis model of the wafer in the model DB 101, the analysis is executed by the analysis execution unit 103, and the result is accumulated in the analysis result DB 104. The model DB 101 is a DB that creates and accumulates the analysis model of the inspection apparatus and the analysis model of the wafer used for analysis in advance. The model of the inspection apparatus is an analysis model of the inspection apparatus designed by an inspection apparatus manufacturer and delivered to a customer. The analysis model of the inspection apparatus is, for example, an analysis model of an optical system or a mechanical system utilized by a designer at the time of design, and is a simple model expressed by an approximate expression or a large-scale model using a method such as a finite element method. In a design stage of the inspection apparatus, it is difficult to completely grasp the specifications of the customer wafer. Thus, a plurality of types of models of the wafer is created based on a trend of a semiconductor device and customer information. The analysis condition setting IF 102 is a screen on which an optical condition, a focus point, an inspection apparatus model that is the model of the inspection apparatus used for analysis, and a wafer model that is the model of the wafer are input as analysis conditions. Details will be described later. The analysis execution unit 103 extracts the inspection apparatus model and the wafer model input to the analysis condition setting IF from the model DB 101, and executes analysis by using the optical condition and the focus point as inputs. The analysis result DB 104 stores the analysis result obtained from the analysis execution unit 103, the analysis condition, and the analysis model in association with each other.

A configuration of the optimum optical condition extraction unit 110 will be described. The observation condition setting IF 105 is a screen on which a wafer specification to be observed, a focus point as an observation position, an index of performance to be optimized at the time of observation, and a priority of each index are input. Details will be described later. The wafer pattern search unit 106 searches the analysis result DB 104 for a wafer pattern of a wafer similar to a wafer pattern to be observed. The optical condition extraction unit 107 extracts an optimum optical condition corresponding to the searched similar wafer pattern and a focus point. The extraction processing of the optimum optical condition will be described in detail later. The optical condition setting unit 108 outputs the optical conditions extracted by the optical condition extraction unit 107. This output includes generating an apparatus control signal corresponding to the optical condition and setting the apparatus control signal in the inspection apparatus, and displaying the optical condition on a display screen. In the latter case, the optical condition is set in the inspection apparatus by an input of a user who refers to the display contents on the display screen. Although not illustrated, the optimum optical condition extraction unit 110 is installed in or connected to the inspection apparatus. The analysis result DB creation unit 109 and the optimum optical condition extraction unit 110 are realized by an information processing apparatus, and each function is executed by a processing unit such as a CPU that performs an arithmetic operation according to a program.

As described above, in the present embodiment, it is possible to predict a customer wafer pattern before the customer wafer is obtained, create the analysis model, and predict the optimum optical condition by the analysis. Accordingly, it is possible to quickly find the optimum optical condition. For example, it is possible to find the optical condition as soon as the customer wafer pattern is known.

Figure 2:
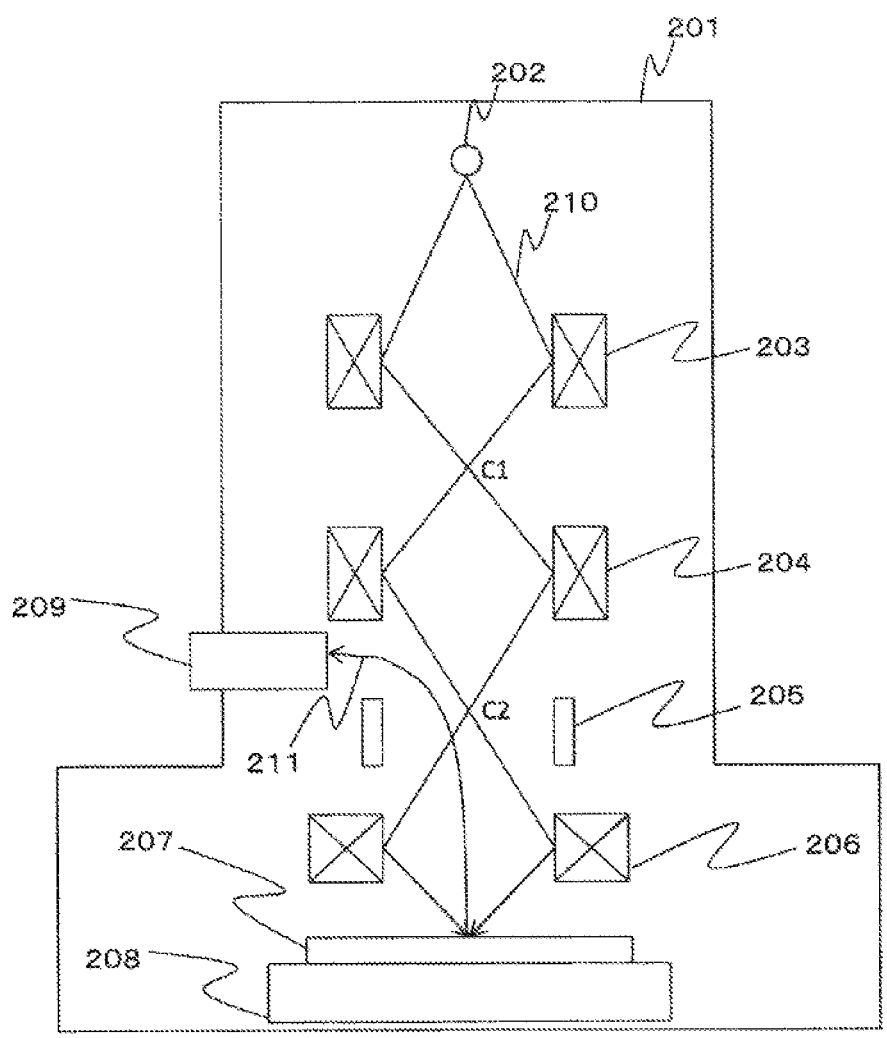
FIG. 2 is a diagram showing an example of a configuration of a CD-SEM.

Hereinafter, a processing method of the inspection apparatus automatic adjustment system according to the first embodiment by using CD-SEM illustrated in FIG. 2 as the inspection apparatus will be specifically described. FIG. 2 is a cross-sectional view illustrating an example of a configuration of the CD-SEM. The CD-SEM includes a column 201 of which an inside is kept vacuum. An electron source 202, a first condenser lens 203 that focuses an electron beam, a second condenser lens 204, a deflector 205 that deflects the electron beam, an objective lens 206 that focuses the electron beam on a sample 207, a stage 208 that fixes the sample, and a detector 209 that detects electrons are provided inside the column 201. A current value and the like of primary electrons 210 emitted from the electron source 202 are controlled while being focused on image planes C1 and C2 by the condenser lens, and are focused on the sample by an objective lens. Secondary electrons 211 reflected from the sample are detected by the detector 209 and displayed as an image.

Examples of the optical condition for obtaining a high-resolution image include an acceleration voltage for accelerating the electron beam from the electron source, an excitation current of the condenser lens or the objective lens, and a current or a voltage of the deflector. Examples of an index of performance required for the inspection apparatus to obtain a high-resolution image include aberration and acceptance. The aberration means that when the electron beam is focused by the lens or the like, the electron beam does not completely converge at one point. When a value is large, image distortion and blurriness are caused. The acceptance represents a rate at which the secondary electrons are collected by the detector, and when the value is small, a clear image cannot be obtained. In the related art, after obtaining the wafer, the optimum optical condition is searched for while viewing the image.

Figure 3:
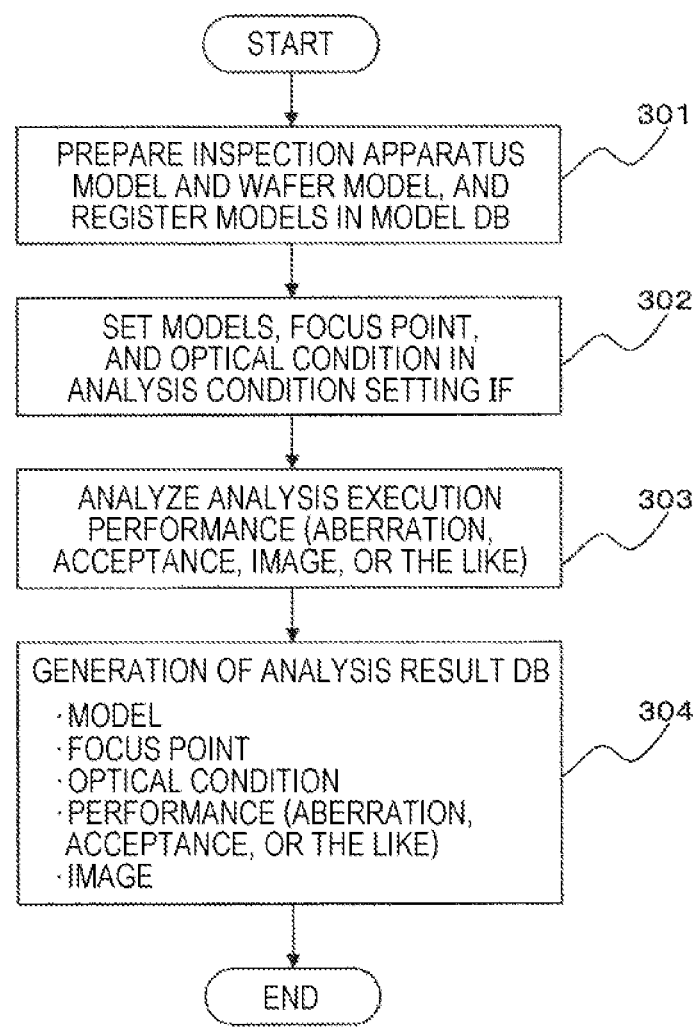
FIG. 3 is a diagram illustrating a flow at the time of using the inspection apparatus automatic adjustment system according to the first embodiment.

FIG. 3 illustrates a utilization procedure and a processing flow of the user when the analysis result DB creation unit 109 creates the analysis result DB 104. Before obtaining the customer wafer, the user creates the model of the wafer based on the trend of the semiconductor device and the customer information, performs analysis, and creates the analysis result DB 104. First, the inspection apparatus model and the wafer model to be used for analysis are prepared and are registered in the model DB 101 (step 301). Subsequently, the models, the focus point, and the optical condition are set in the analysis condition setting IF 102 (step 302).

The user operates the analysis condition setting IF in FIG. 4. This is displayed on a display screen of the optimum optical condition extraction unit 110 or a display screen connected to the CD-SEM. A screen 401 of the analysis condition setting IF includes a model setting unit 402, a focus point selection unit 403, an optical condition input setting unit 404, and an analysis execution button 405. The models to be used for analysis are selected by inputting symbols of the inspection apparatus model and the wafer model registered in the model DB to the model setting unit 402. In the focus point selection unit 403, a focus point associated with the wafer model in advance, such as a surface or a groove bottom, is selected. Alternatively, any focus point may be input. Conditions such as an acceleration voltage, an electrode voltage, and an excitation current are input to the optical condition input setting unit 404. Assuming that analysis is performed efficiently, each combination condition may be automatically generated by inputting a maximum value, a minimum value, and a step size of each condition. The analysis execution unit 103 executes analysis to obtain performance such as acceptance and aberration and an observation image by pressing the analysis execution button 405 provided on the screen. (step 303)

Subsequently, the analysis result DB 104 including the analysis results in which the models used for the analysis, the optical condition as the analysis condition, and the analysis result are associated with each other is created (step 304). FIG. 5 shows an example of the analysis result DB 104. The inspection apparatus model and the wafer model used for analysis, the focus point and the optical condition which are input conditions of analysis, output result performance of analysis, and an image are collectively stored as one result in one row. When the models and the optical condition are different, a row is newly added and the result is stored.

Figure 7:
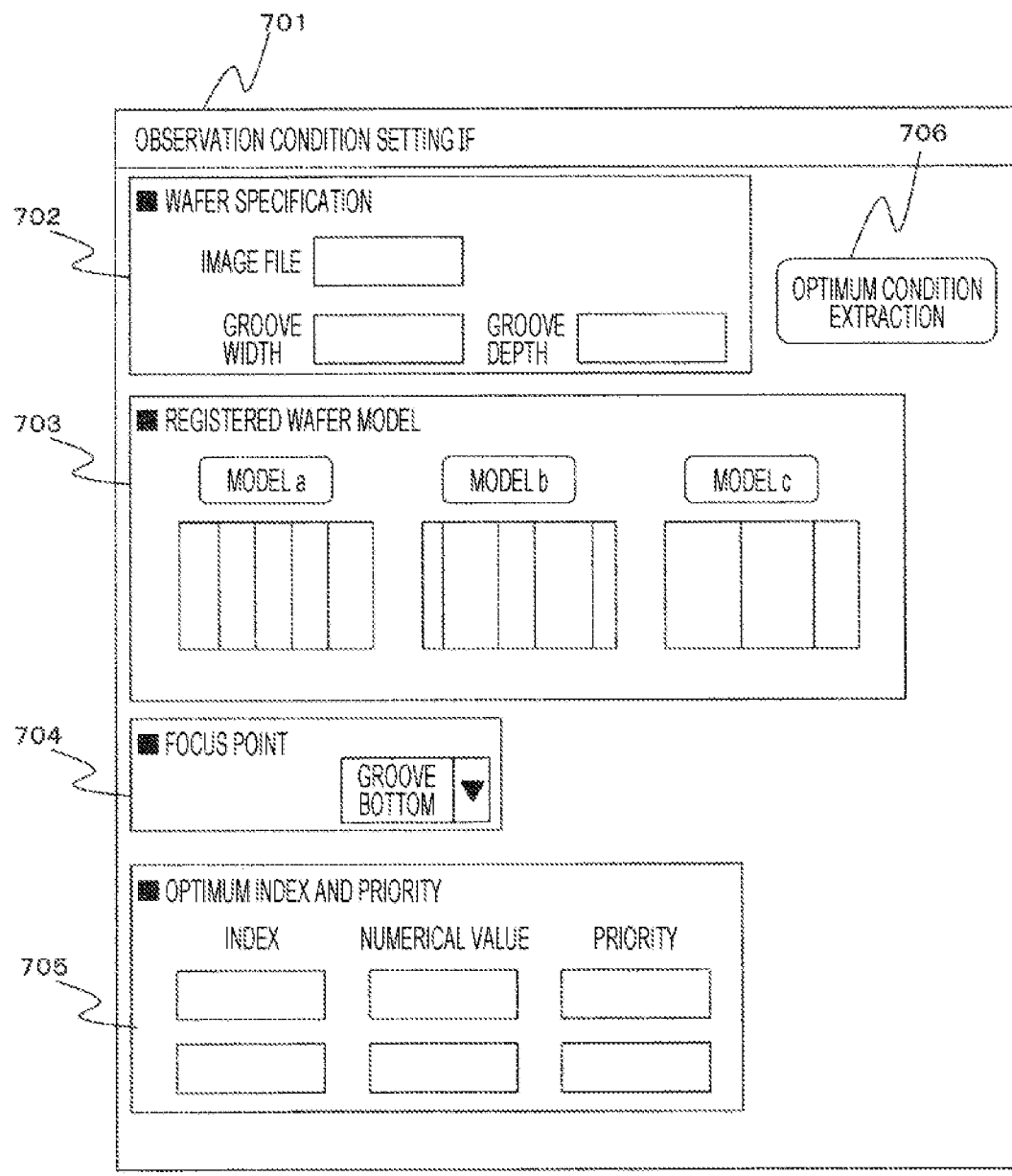
FIG. 7 is an example of an input screen of the inspection apparatus automatic adjustment system according to the first embodiment.

FIG. 6 illustrates a utilization procedure of the user and a processing flow of the optimum optical condition extraction unit 110 when the optimum optical condition extraction unit 110 extracts the optimum optical condition. In this processing, the user operates the observation condition setting IF in FIG. 7 as the utilization procedure, and the optimum optical condition extraction unit 110 performs processing according to this operation. A screen 701 of the observation condition setting IF used in the utilization procedure includes a wafer specification setting unit 702, a registered wafer model selection unit 703, a focus point selection unit 704, an optimization index and priority setting unit 705, and an optimum condition extraction button 706. The observation condition setting IF is displayed on the display screen of the optimum optical condition extraction unit 110 or the display screen connected to the CD-SEM as in FIG. 4. Note that the focus point selection unit 704 has a function similar to that of the focus point selection unit 403 illustrated in FIG. 4.

Hereinafter, the utilization procedure and the processing procedure will be described. First, the user inputs the specification of the customer wafer or selects a wafer close to the customer wafer from the wafer model registered in advance. The user inputs the specification of the customer wafer by using the wafer specification setting unit 702. In the specification of the customer wafer, an image file of a surface or a cross section of an SEM image captured at a low magnification, and a geometric shape such as a groove width or a groove depth is input as the specification of the wafer. The specification is data transmitted from the customer side via a network or a storage medium, and is received by the optimum optical condition extraction unit 110 via an interface (not illustrated). A wafer provided as a standard wafer from the customer may be captured by the inspection apparatus and may be used as the specification.

The registered wafer model selection unit 703 is used to select a similar wafer from a surface pattern shape of the wafer, for example. The content and the models displayed on the registered wafer model selection unit 703 are visually compared with the image included in the specification, and the user selects a similar model.

The user inputs, to the focus point selection unit 704, a focus point such as a surface or a groove bottom, that is, a focus point indicating a location where the inspection apparatus focuses on the sample.

That is, the observation condition setting IF 105 of the optimum optical condition extraction unit 110 receives these inputs and selections (step 601).

Subsequently, the user inputs, to the optimization index and priority setting unit 705, an index to be prioritized when the wafer is observed, a numerical value thereof, and a priority. For example, a target numerical value or a target priority of aberration or acceptance is input. That is, the observation condition setting IF 105 receives these inputs (step 602).

The user presses the optimum condition extraction button 706 provided on the screen, and thus, the wafer pattern search unit 106 of the optimum optical condition extraction unit 110 searches for wafer patterns of which focus points are coincident in wafers having similar patterns (step 603). Details of this search are as follows. First, the analysis result including "wafer model" corresponding to the model selected by using the registered wafer model selection unit 703 in step 601 is primarily extracted from the analysis result DB 104. An image (observed image) detected by the CD-SEM is received, and an image similar to the detected image is secondarily extracted from the analysis result obtained by the primary extraction, that is, is searched for. That is, an image satisfying a predetermined criterion such as a predetermined degree of similarity or more is searched for by image search. This search may be realized, for example, by using machine learning and searching for similar images.

In the present embodiment, the primary extraction is performed, but may be omitted. In this case, the selection using the registered wafer model selection unit 703 in step 601 or the input of the specification using the wafer specification setting unit 702 may be omitted.

Subsequently, the optimum optical condition for the searched wafer is extracted (step 604). That is, the optical condition extraction unit 107 extracts, as the optimum optical condition, the optical condition included in the analysis result having the image searched for in step 603.

Figure 8:
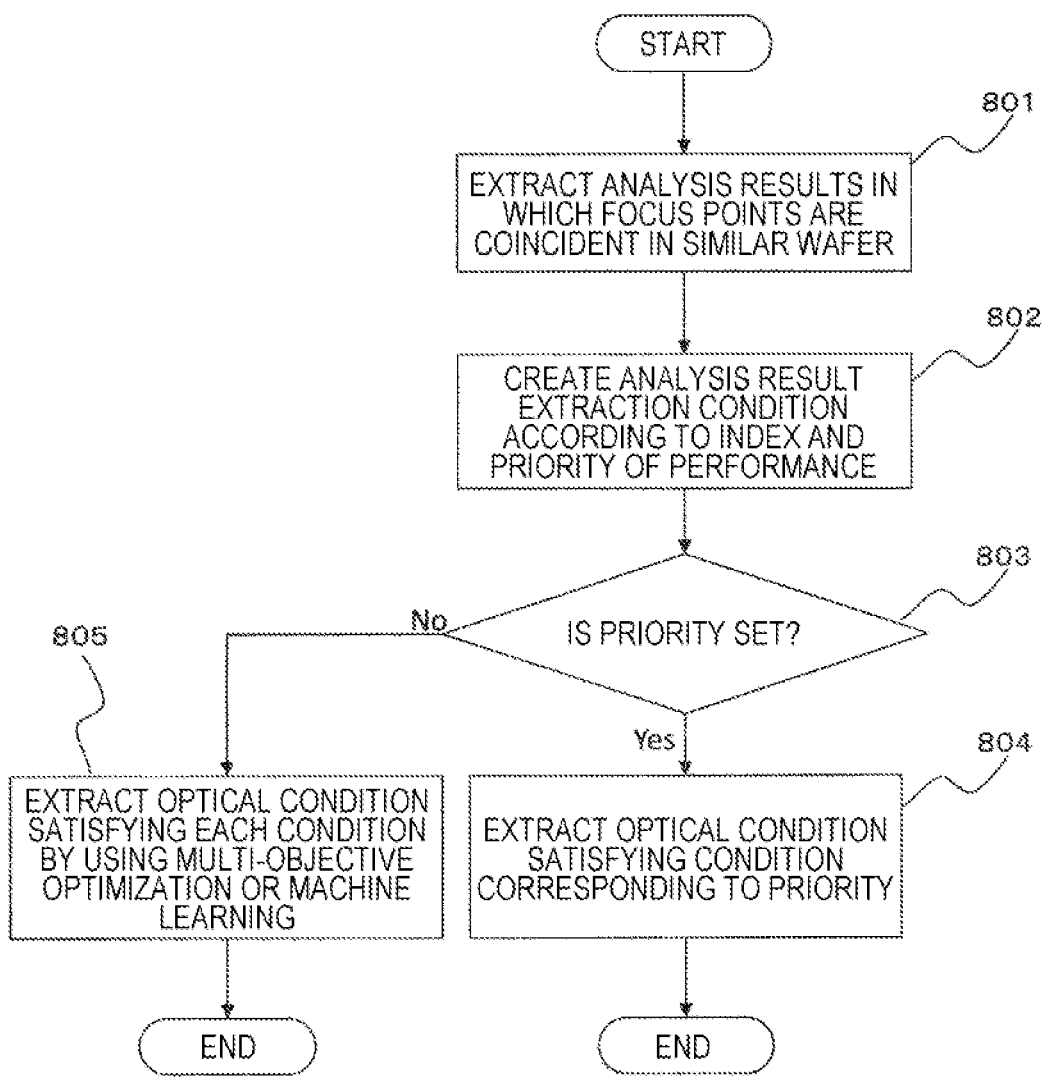
FIG. 8 is a diagram illustrating a flow of optimum optical condition extraction of the inspection apparatus automatic adjustment system according to the first embodiment.

Here, the detailed processing of step 604 of extracting the optimum optical condition in the similar wafer is illustrated in FIG. 8. This processing is performed by the optical condition extraction unit 107. First, the analysis result with the same focus point on the similar wafer is extracted from the analysis result DB 104 (step 801). That is, an analysis result in which the focus point of the data including the image searched for in step 603 has a focus point coincident with the focus point input via the focus point selection unit 704 in step 601 is specified. When the number of analysis results is a predetermined number (for example, one), the following processing may be omitted, the optical condition included in the analysis result extracted in this step may be extracted, and the processing may be ended. In this case, the specified optical condition is output. An output destination may be the display screen of the optimum optical condition extraction unit 110 or the CD-SEM of FIG. 2. In the case of the CD-SEM of FIG. 2, the CD-SEM receives the optical condition, and adjusts the optical condition according to the received optical condition.

Subsequently, an extraction condition of the analysis result is created according to the index of the performance and the priority set in the observation condition setting IF 105 (step 802). That is, in step 602, an extraction condition that satisfies a priority order of the index and the numerical value input via the optimization index and priority setting unit 705 is created.

Here, it is determined in step 602 whether the priority is set (step 803).

When the priority is set, a condition matching the priority is created, and a satisfactory result is extracted. For example, when a priority of an aberration of 1 µm or less is 1 and a priority of an acceptance of 0.8 or more is 2, two conditions are created for the aberration and the acceptance. That is, the optical condition under which the aberration is 1 µm or less and the optical condition under which the acceptance is 0.8 or more are separately extracted (step 804).

On the other hand, when the priority is not set, an optical condition that satisfies each condition is extracted by using multi-objective optimization or machine learning (step 805). For the multi-objective optimization, there is a method of sampling a representative analysis result to create a response curved surface and using a genetic algorithm, and there is a method of using a neural network, a decision tree, or the like for machine learning.

Note that the method described above is an example of the extraction of the optimum optical condition, and the present invention is not limited to these methods.

Second Embodiment

Figure 9:
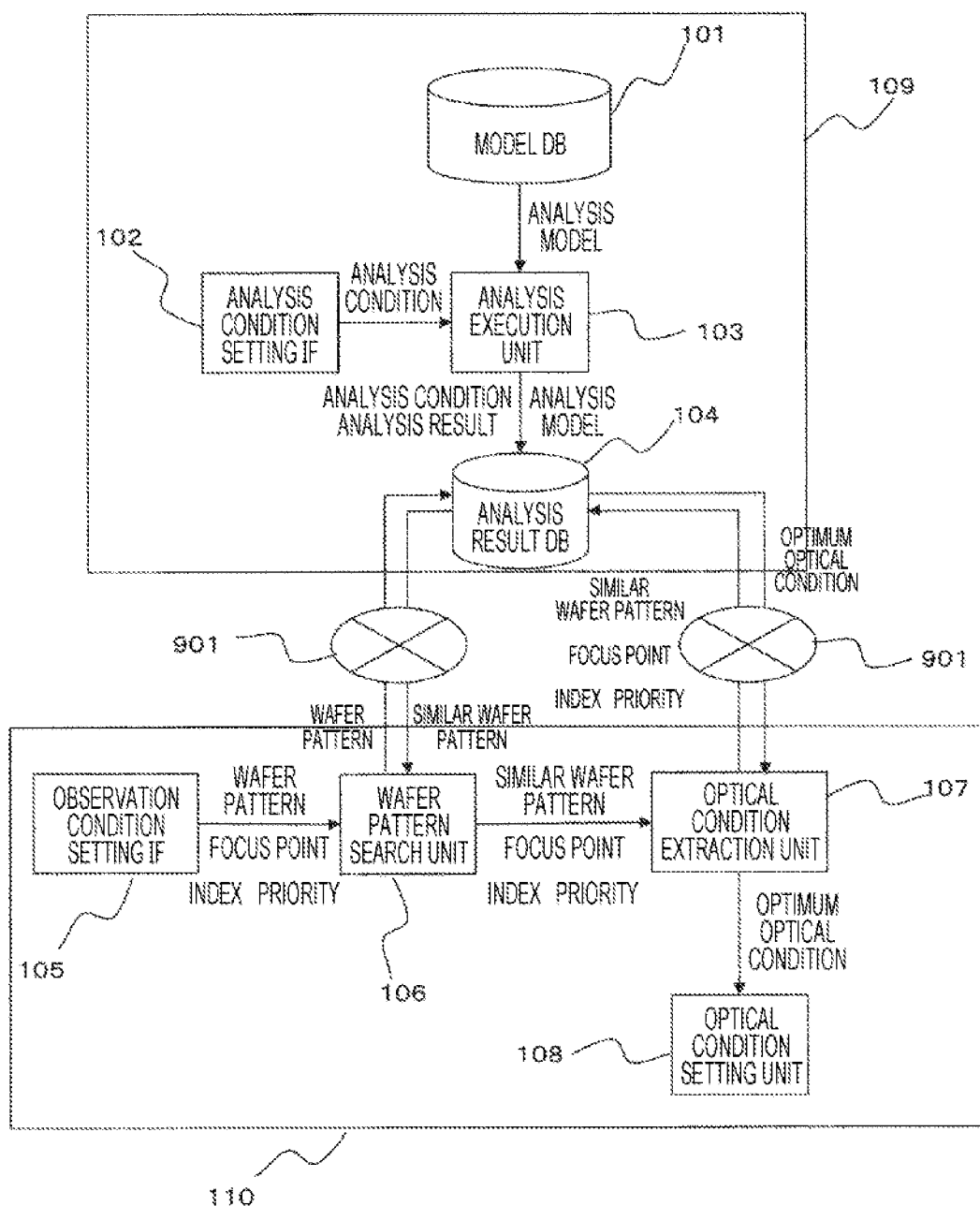
FIG. 9 is a configuration diagram of an inspection apparatus automatic adjustment system according to a second embodiment.

Next, FIG. 9 illustrates an inspection apparatus automatic adjustment system according to a second embodiment. In the second embodiment, the analysis result DB creation unit 109 is connected to various apparatuses and databases via a network 901. The specification can be received via the network 901, and the analysis result DB 104 can be shared by a plurality of inspection apparatuses. That is, a cloud configuration of the analysis result DB creation unit 109 is realized.

For example, when the specification of the wafer to be inspected is greatly different even after the delivery of the inspection apparatus, it is necessary to set the optical condition again, but it is assumed that there is no model of the wafer in the model DB. Thus, the analysis result DB creation unit 109 of the inspection apparatus automatic adjustment system is constructed in a PC in the inspection apparatus manufacturer, and the optimum optical condition extraction unit 110 is provided in the inspection apparatus main body and is connected by the network 901 such as the Internet. As described above, the analysis result DB 104 can be accumulated according to a latest state of the wafer or the inspection apparatus, such as updating the inspection apparatus model when the inspection apparatus is improved, in addition to the wafer model of the model DB.

With the above configuration, it is possible to extract the optimum optical condition corresponding to the reconstruction of the inspection apparatus and the update of the wafer pattern after delivery.

Third Embodiment

FIG. 10 illustrates another example of the method of extracting the optimum optical condition illustrated in FIG. 8. This is an extraction flow of the optimum optical condition on the assumption that a width of a deep hole bottom is measured. In order to measure the width with high accuracy, it is necessary to focus on the bottom, but a depth may vary in an actual wafer. Processing performed by the optical condition extraction unit 107 for solving this problem will be described below.

First, an estimated value of the variation in depth is set (step 1001). This is set based on past actual values and information from the customer. For example, a deviation in depth included in a depth actual value in the past inspection input via the observation condition setting IF 105 or information from the customer is calculated and used as an estimated value.

Subsequently, the optimum optical condition obtained from the analysis model (wafer model and inspection apparatus model) in which the depth is changed by several patterns according to the estimated value is extracted (step 1002). This is realized by extracting a plurality of analysis models from the analysis result DB 104 such that differences in depth are leveled within a range of the estimated value (deviation).

The analysis result including the extracted analysis model is specified, the optical condition of the analysis result is set in the inspection apparatus, and a pattern is measured (step 1003).

The optical condition having the best measurement result is selected (step 1004). This selection is realized by selecting the measurement result that most satisfies a predetermined condition or by the user selecting the measurement result from the measurement result displayed on the screen of the optimum optical condition extraction unit 110 or the like.

Finally, it is determined whether measurement accuracy is sufficient (step 1005). When the measurement accuracy is sufficient, the processing is ended. When the measurement accuracy is not sufficient, a variation range of the depth is narrowed around a depth of the analytical model under the best optical condition obtained in step 1004, and is set (that is, the processing returns to step 1001). Setting and measurement are performed in the apparatus. This flow is repeated. Note that the determination in step 1005 may be performed depending on whether a preset condition is satisfied, or the user may confirm the content displayed on the screen of the optimum optical condition extraction unit 110 or the like.

As described above, the optimum optical condition can be extracted even when there is little information about the specification of the customer wafer by selecting the best optical condition in combination with the measurement result of the apparatus.

In the present embodiment, the "width of the deep hole bottom" has been described as an example, but the present invention is applicable to a dimension of the sample including the wafer to be inspected, and is applicable to the "width of the deep hole bottom". The dimension includes the depth of the deep hole bottom and the like. The present embodiment can be applied to any configuration illustrated in FIGS. 1 and 9.

REFERENCE SIGNS LIST

101 model DB
102 analysis condition setting IF
103 analysis execution unit
104 analysis result DB
105 observation condition setting IF
106 wafer pattern search unit
107 optical condition extraction unit
108 optical condition setting unit
109 analysis result DB creation unit
110 optimum optical condition extraction unit
201 column
202 electron source
203 first condenser lens
204 second condenser lens
205 deflector
206 objective lens
207 sample
208 stage
209 detector
210 primary electron
211 secondary electron
401 screen of analysis condition setting IF
402 model setting unit
403 focus point selection unit
404 optical condition input setting unit
405 analysis execution button
701 screen of observation condition setting IF
702 wafer specification setting unit
703 registered wafer model selection unit
704 focus point selection unit
705 optimization index and priority setting unit
706 optimum condition extraction button
901 network

The invention claimed is:

1. An inspection apparatus adjustment system that adjusts an inspection apparatus which inspects samples,
   wherein an analysis result database that stores, for each sample, an inspection apparatus model indicating a model of an inspection apparatus, a sample model indicating a model of a sample, a focus point indicating a location where the inspection apparatus focuses on the sample, and an analysis result including a sample image of the sample and an optical condition of the sample in the inspection apparatus is available, and
   the inspection apparatus adjustment system includes
   receiver an inspection sample image indicating an image of a sample to be inspected from the inspection apparatus;
   searcher for an analysis result having a sample image similar to the received inspection sample image from the analysis result database;
   extractor an optical condition included in the searched analysis result; and
   outputter the extracted optical condition.

2. The inspection apparatus adjustment system according to claim 1,
   wherein the searcher for the analysis result searches for a plurality of analysis results from the analysis result database, and
   the extractor the optical condition specifies the analysis result having the similar sample image from the plurality of searched analysis results, and extracts the optical condition from the specified analysis result.

3. The inspection apparatus adjustment system according to claim 2,
   wherein performance in an inspection is further stored in the analysis result database,
   the inspection apparatus adjustment system further includes
   receiver designation of an inspection apparatus model, a sample model, and a focus point, and
   receiver designation of performance in an inspection to which a priority is given, and
   extractor the optical condition specifies the analysis result having the similar sample image from the plurality of analysis results according to the received priority, and extracts the optical condition from the specified analysis result.

4. The inspection apparatus adjustment system according to claim 3, wherein the searcher for the analysis result extracts the optical condition by using multi-objective optimization or machine learning according to the priority.

5. The inspection apparatus adjustment system according to claim 1,
   wherein the extractor the optical condition
   sets a plurality of estimated values obtained by estimating variations in dimensions of the sample to be inspected,
   extracts a plurality of optical conditions corresponding to the plurality of set estimated values, and
   specifies one of the plurality of extracted optical conditions.

6. An inspection apparatus adjustment method using an inspection apparatus adjustment system that adjusts an inspection apparatus which inspects samples, wherein the inspection apparatus adjustment system is connectable to an analysis result database that stores, for each sample, an inspection apparatus model indicating a model of an inspection apparatus, a sample model indicating a model of a sample, a focus point indicating a location where the inspection apparatus focuses on the sample, and an analysis result including a sample image of the sample and an optical condition of the sample in the inspection apparatus, and the inspection apparatus adjustment method includes a step of receiving an inspection sample image indicating an image of a sample to be inspected from the inspection apparatus, a step of searching for an analysis result having a sample image similar to the received inspection sample image from the analysis result database, a step of extracting an optical condition included in the searched analysis result, and a step of outputting the extracted optical condition.

7. The inspection apparatus adjustment method according to claim 6, wherein, in the step of searching for the analysis result, a plurality of analysis results is searched for from the analysis result database, and in the step of extracting the optical condition, the analysis result having the similar sample image is specified from the plurality of searched analysis results, and the optical condition is extracted from the specified analysis result.

8. The inspection apparatus adjustment method according to claim 7, wherein performance in an inspection is further stored in the analysis result database, the inspection apparatus adjustment method further includes a step of receiving designation of an inspection apparatus model, a sample model, and a focus point, and a step of receiving designation of performance in an inspection to which a priority is given, and in the step of extracting the optical condition, the analysis result having the similar sample image is specified from the plurality of analysis results according to the received priority, and the optical condition is extracted from the specified analysis result.

9. The inspection apparatus adjustment method according to claim 8, wherein, in the step of searching for the analysis result, the optical condition is extracted by using multi-objective optimization or machine learning according to the priority.

10. The inspection apparatus adjustment method according to claim 6, wherein, in the step of extracting the optical condition, a plurality of estimated values obtained by estimating variations in dimensions of the sample to be inspected is set, a plurality of optical conditions corresponding to the plurality of set estimated values is extracted, and one of the plurality of extracted optical conditions is specified.

11. An inspection apparatus that inspects samples, wherein an analysis result database that stores, for each sample, an inspection apparatus model indicating a model of an inspection apparatus, a sample model indicating a model of a sample, a focus point indicating a location where the inspection apparatus focuses on the sample, and an analysis result including a sample image of the sample and an optical condition of the sample in the inspection apparatus is available, and the inspection apparatus includes capturer an inspection sample image indicating an image of a sample to be inspected from the inspection apparatus, searcher for an analysis result having a sample image similar to the captured inspection sample image from the analysis result database, extractor an optical condition included in the searched analysis result, and outputter the extracted optical condition.

12. The inspection apparatus according to claim 11, wherein the searcher for the analysis result searches for a plurality of analysis results from the analysis result database, and the extractor the optical condition specifies the analysis result having the similar sample image from the plurality of searched analysis results, and extracts the optical condition from the specified analysis result.

13. The inspection apparatus according to claim 12, wherein performance in an inspection is further stored in the analysis result database, the inspection apparatus further includes receiver designation of an inspection apparatus model, a sample model, and a focus point, and receiver designation of performance in an inspection to which a priority is given, and the extractor the optical condition specifies an analysis result having the similar sample image from the plurality of analysis results according to the received priority, and extracts the optical condition from the specified analysis result.

14. The inspection apparatus according to claim 13, wherein the searcher for the analysis result extracts the optical condition by using multi-objective optimization or machine learning according to the priority.

15. The inspection apparatus according to claim 11, wherein the extractor the optical condition sets a plurality of estimated values obtained by estimating variations in dimensions of the sample to be inspected, extracts a plurality of optical conditions corresponding to the plurality of set estimated values, and specifies one of the plurality of extracted optical conditions.

* * * * *